US008301286B2

(12) United States Patent
Babu et al.

(10) Patent No.: US 8,301,286 B2
(45) Date of Patent: Oct. 30, 2012

(54) REMOTE HIGH-PERFORMANCE COMPUTING MATERIAL JOINING AND MATERIAL FORMING MODELING SYSTEM AND METHOD

(75) Inventors: Sudarsanam S. Babu, Dublin, OH (US); Chris Conrardy, Columbus, OH (US); Shuchi P. Khurana, Columbus, OH (US); Wei Zhang, Upper Arlington, OH (US); Wei Gan, Lewis Center, OH (US)

(73) Assignee: Edison Welding Institute, Inc., Columbus, OH (US)

( * ) Notice: Subject to any disclaimer, the term of this patent is extended or adjusted under 35 U.S.C. 154(b) by 288 days.

(21) Appl. No.: 12/596,615

(22) PCT Filed: Apr. 21, 2008

(86) PCT No.: PCT/US2008/061032
§ 371 (c)(1),
(2), (4) Date: Oct. 19, 2009

(87) PCT Pub. No.: WO2009/009204
PCT Pub. Date: Jan. 15, 2009

(65) Prior Publication Data
US 2010/0121472 A1    May 13, 2010

Related U.S. Application Data
(60) Provisional application No. 60/925,464, filed on Apr. 20, 2007.

(51) Int. Cl.
*G06F 19/00* (2011.01)
(52) U.S. Cl. .............................................. 700/98; 703/1
(58) Field of Classification Search ............ 700/97, 700/98, 104, 106, 117, 118, 173, 182, 212; 345/419, 420; 623/18.11, 1.11; 606/76; 703/1, 2, 6
See application file for complete search history.

(56) References Cited

U.S. PATENT DOCUMENTS
| | | |
|---|---|---|
| 5,202,837 A | 4/1993 | Coe et al. |
| 6,560,500 B2 | 5/2003 | St. Ville |
| 7,203,628 B1 | 4/2007 | St. Ville |
| 7,318,011 B2 * | 1/2008 | Subrahmanyam ................ 703/1 |

OTHER PUBLICATIONS
International Searching Authority—United States Patent and Trademark Office, International Search Report for PCT/US2008/061032, Dec. 15, 2008, 2 pages.
International Searching Authority—United States Patent and Trademark Office, Written Opinion of the International Searching Authority for PCT/US2008/061032, Dec. 15, 2008, 11 pages.

* cited by examiner

*Primary Examiner* — John R. Cottingham
*Assistant Examiner* — Chad Rapp
(74) *Attorney, Agent, or Firm* — McNees Wallace & Nurick, LLC

(57) ABSTRACT

A remote high-performance computing material joining and material forming modeling system (100) enables a remote user (10) using a user input device (20) to use high speed computing capabilities to model materials joining and material forming processes. The modeling system (100) includes an interface module (200), an application module (300), a computing module (400), and a scheduling module (500). The interface module (200) is in operative communication with the user input device (20), as well as the application module (300), the computing module (400), and the scheduling module (500). The application module (300) is in operative communication with the interface module (200) and the computing module (400). The scheduling module (500) is in operative communication with the interface module (200) and the computing module (400). Lastly, the computing module (400) is in operative communication with the interface module (200), the application module (300), and the scheduling module (500).

20 Claims, 13 Drawing Sheets

Average cooling rates between 800 and 500 °C. Zero cooling rate means that the peak temperature at that monitoring location is less than 500 °C.

| Weld Pass | Location A | Location B | Location C | Location D |
|---|---|---|---|---|
| 1 | | | | |
| 2 | 110.9 | 109.9 | | |
| 3 | | 154.2 | | |
| 4 | | | | |
| 5 | | | | |
| 6 | | | 140.9 | 152.1 |
| 7 | | | 499.7 | 459.5 |

\* The cooling rate (°C/second) between 800 to 500 °C is an important parameter for evaluating the tendency to form hard microstructure (martensite) in steels. This parameter is used in estimating the microstructure and hardness. The locations A to D are shown in the original geometry page. This table can be used to evaluate subtle variations in cooling rate as a function of input conditions.

Fig. 9

REMOTE HIGH-PERFORMANCE COMPUTING MATERIAL JOINING AND MATERIAL FORMING MODELING SYSTEM AND METHOD

REFERENCE TO RELATED DOCUMENTS

This application is a national stage application under 35 U.S.C. §371 of International Application No. PCT/US2008/061032, filed Apr. 21, 2008, which claims priority to U.S. Provisional Patent Application No. 60/925,464, filed Apr. 20, 2007, the contents of which are incorporated herein by reference.

TECHNICAL FIELD

The instant invention relates to the field of high-performance computer modeling of complex processes such as material joining, including welding, and material forming, particularly a system for such that facilitates the use of remote high-performance computing resources.

BACKGROUND OF THE INVENTION

Computer simulation and modeling of complex material joining processes, forming processes, and related allied processes, such as heat treatment, heat transfer, and phase transformation, have long been difficult to model on the computer. Modeling such processes typically requires a dedicated engineer working on a daily basis with finite element analysis programs. Further, such modeling and analysis programs often require tremendous computing power to model even the most basic processes; computing power that is often not available to engineers in industry. Additionally, engineers recreate many common modeling scenarios every year from scratch simply because modeling simulations that have been experimentally verified are not widely available.

The field of mechanical and materials computer modeling has been lacking a formalized structured modeling method for common modeling scenarios that have been experimentally verified, which also guides the user through the data entry process ensuring that a model can be created, and takes advantage of high-performance computing capabilities to remote supercomputing centers during off-peak time periods. The present invention fills this need and provides practicing engineers the confidence to model verified scenarios without requiring the engineer to be an expert at creating finite element analysis models. Such flexibility encourages the modeling of multiple "what-if" scenarios by making simple data entry changes rather than having to modify a complex finite element analysis model.

SUMMARY OF INVENTION

In its most general configuration, the present invention advances the state of the art with a variety of new capabilities and overcomes many of the shortcomings of prior devices in new and novel ways. In its most general sense, the present invention overcomes the shortcomings and limitations of the prior art in any of a number of generally effective configurations. The instant invention demonstrates such capabilities and overcomes many of the shortcomings of prior methods in new and novel ways.

The remote high-performance computing modeling system of the present invention enables a remote user using a user input device to use high speed computing capabilities to model materials joining processes, forming processes, and allied processes which rely on heat-flow and phase transformation analysis, including, but not limited to, heat treatment, heat transfer, and phase transformation. The remote high-performance computing modeling system includes an interface module, an application module, a computing module, and a scheduling module. The interface module is in operative communication with the user input device, as well as the application module, the computing module, and the scheduling module.

The application module is in operative communication with the interface module and the computing module. The scheduling module is in operative communication with the interface module and the computing module. Lastly, the computing module is in operative communication with the interface module, the application module, and the scheduling module.

The remote high-performance computing modeling system exists in a digital environment with a physical existence manifested as a plurality of computers and servers in electrical communication with each other and electronically linked via the Internet, or other wide area network, over vast distances. Therefore, operative communication as used herein refers to the ability to transfer data via any means, whether wired or wirelessly.

These variations, modifications, alternatives, and alterations of the various preferred embodiments may be used alone or in combination with one another, as will become more readily apparent to those with skill in the art with reference to the following detailed description of the preferred embodiments and the accompanying figures and drawings.

BRIEF DESCRIPTION OF THE DRAWINGS

Without limiting the scope of the present invention as claimed below and referring now to the drawings and figures:

FIG. 9 is one embodiment of a sample automatically generated solution (440) illustrating average cooling rates;

DETAILED DESCRIPTION OF THE INVENTION

The present invention includes a remote high-performance computing material joining and material forming modeling system and method. The invention enables a significant advance in the state of the art. The preferred embodiments of the apparatus accomplish this by new and novel methods that are configured in unique and novel ways and which demonstrate previously unavailable but preferred and desirable capabilities. The description set forth below in connection with the drawings is intended merely as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention.

Figure 1:
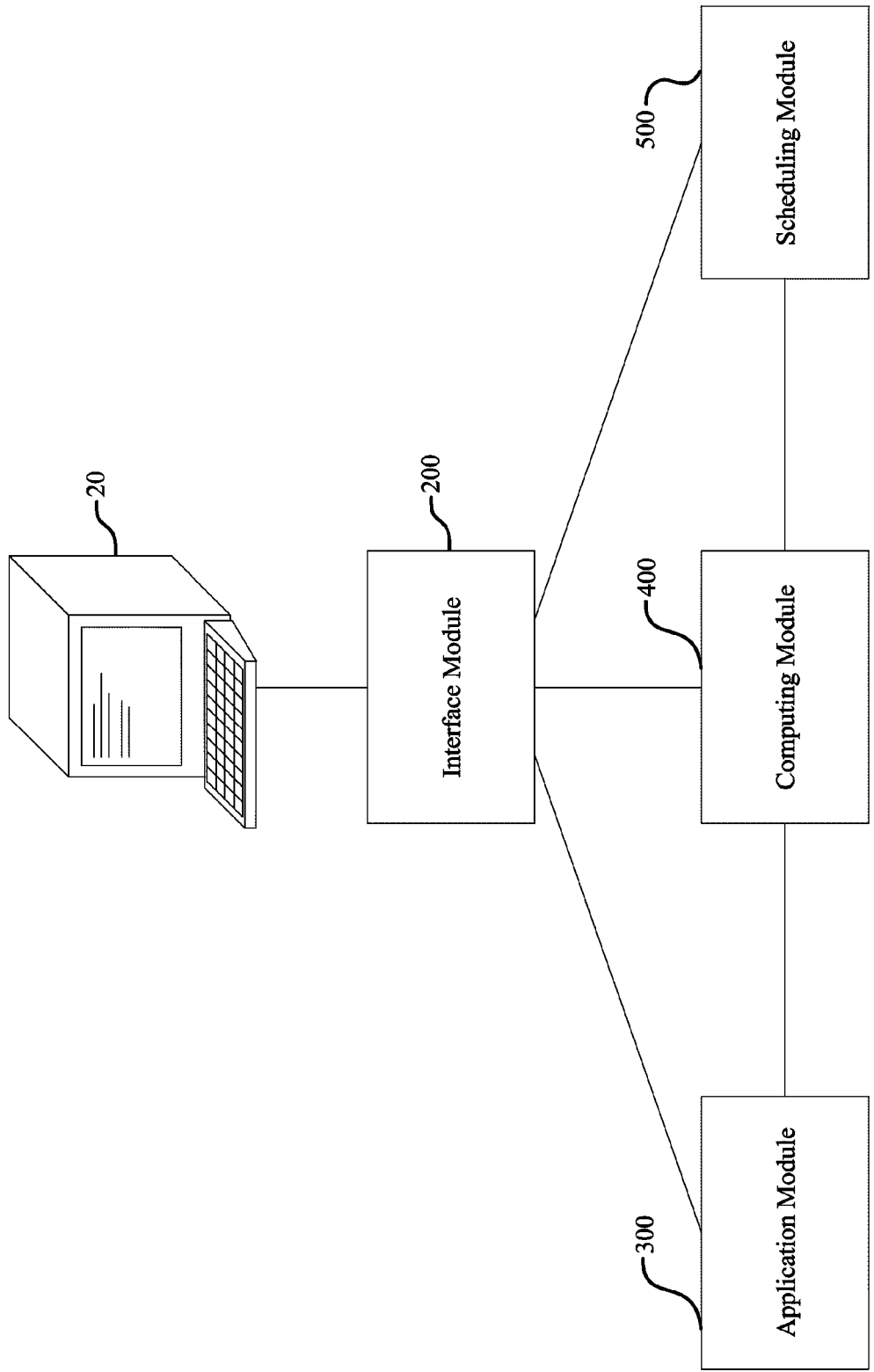
FIG. 1 is a schematic of one embodiment of the present invention, not to scale.

The remote high-performance computing material joining and material forming modeling system (100) of the present invention enables a remote user (10) using a user input device (20) to use high speed computing capabilities to model materials joining processes, forming processes, and allied processes which rely on heat-flow and phase transformation analysis, including, but not limited to, heat treatment and material modeling. As seen in FIG. 1, the remote high-performance computing material joining and material forming modeling system (100) includes an interface module (200), an application module (300), a computing module (400), and a scheduling module (500). The interface module (200) is in operative communication with the user input device (20), as well as the application module (300), the computing module (400), and the scheduling module (500).

The application module (300) is in operative communication with the interface module (200) and the computing module (400). The scheduling module (500) is in operative communication with the interface module (200) and the computing module (400). Lastly, the computing module (400) is in operative communication with the interface module (200), the application module (300), and the scheduling module (500).

The remote high-performance computing material joining and material forming modeling system (100) exists in a digital environment with a physical existence manifested as a plurality of computers and servers in electrical communication with each other and electronically linked via the Internet, or other wide area network, over vast distances. Therefore, operative communication as used herein refers to the ability to transfer data via any means, whether wired or wirelessly.

Now, each module with be discuss in further detail beginning with the interface module (200). The interface module (200) provides the secure access to the remote high-performance computing material joining and material forming modeling system (100). The interface module (200) is the remote high-performance computing material joining and material forming modeling system's (100) method of obtaining information from the remote user (10) and presenting information to the remote user (10). The interface module (200) may track the financial transactions with the remote user (10), including the status of bulk time, or execution, purchases allowing access to the system (10). In other words, if the remote user (10) purchased a one week access package, or a package limited to a specific number of executions, the interface module (200) would keep the remote user (10) informed as to when the access will terminate. The interface module (200) may also keep usage logs as well as function as a source of general user information, such as frequently asked questions, training manuals, previously run conditions, and outputs. The interface module (200) may also provide access to additional engineering databases such as a weld procedure information database and an empirical test data database. Further, the interface module (200) may facilitate the remote user (10) to contribute data to the weld procedure information database and the empirical test data database, to search such databases, and retrieve weld procedure information and empirical test data. One embodiment of the system (100) allows the remote user (10) to receive credit for contributing to the weld procedure information database and the empirical test data database. The remote user (10) may then use such credits in a number of ways including accessing the databases to retrieve information as well as using the credit to purchase additional modeling solutions.

The interface module (200) may receive user identification data from the remote user (10). The user identification data (210) may include data such as login name and password. Further, the interface module (200) may receive financial transaction data from the remote user (10). The financial transaction data may include payment data such as credit card information, electronic funds transfer data, wire transfer information, and any other electronic commerce payment data. The interface module (200) may also report data to the remote user (10) such as the running cost-to-date (annual/monthly/weekly), as well as the financial resources remaining (i.e. not spent balance). As will be further explained later, the interface module (200) also receives output data from the computing module (400) and formats such data for easy use, or as directed by the remote user (10). The interface module (200) may also report to the remote user (10) regarding resource availability data such as the system status, as well as a resource availability profile, which may be displayed as a calendar of available times to perform the analysis. Further, the interface module (200) may keep the remote user (10) apprised of the status of a particular analysis by displaying project status data, which may be as simple as the percentage of the simulation that is complete.

The application module (300) incorporates a joining methodology database (310), a joint geometry database (320), a modeling material database (350), and an application qualification standard (390). In another embodiment the application module (300) incorporates a forming methodology database (610), an initial component geometry database (620), a modeling material database (350), an application qualification standard (390), and optionally a final component geometry database (650). In yet another embodiment, seen in FIG. 11, the application module (300) incorporates a heat treatment database (710), a modeling material database (350), a post-treatment material property database (720) having at least one post-treatment material property (722) and optionally a user specified post-treatment material property (724), and an application qualification standard (390). In yet another embodiment the application module (300) incorporates a heat transfer database (810), a modeling material database (350), a heat transfer influencer database (820), and an application qualification standard (390). In yet another embodiment the application module (300) incorporates a phase transformation database (910), a modeling material database (350), a phase transformation influencer database (920), and an application qualification standard (390). Still further embodiments may incorporate one or more of the joining methodology database (310), the forming methodology database (610), the heat treatment database (710), the heat transfer database (810), and the phase transformation influencer database (920).

Figure 2:
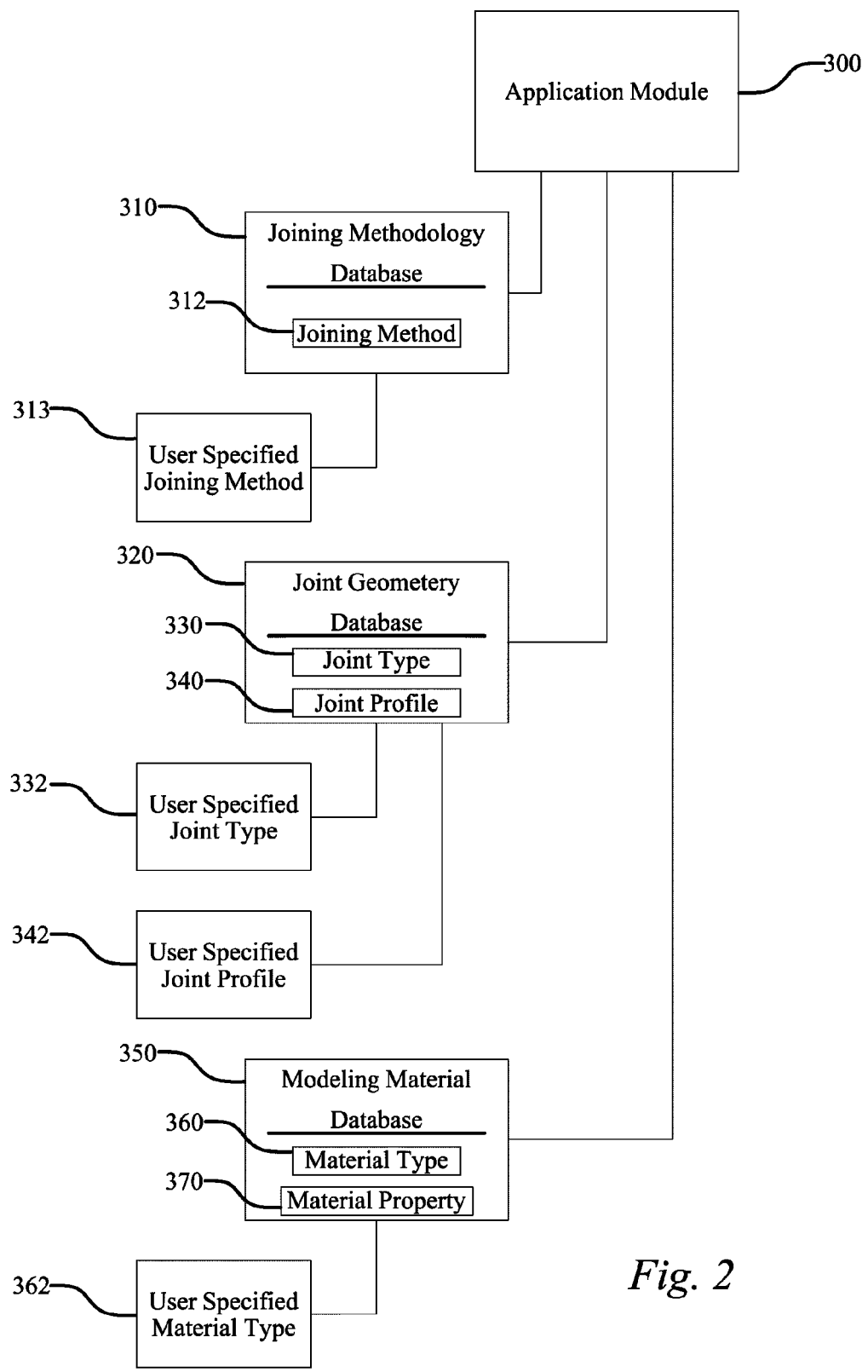
FIG. 2 is a schematic of one embodiment of the application module of the present invention, not to scale.
Figure 3:
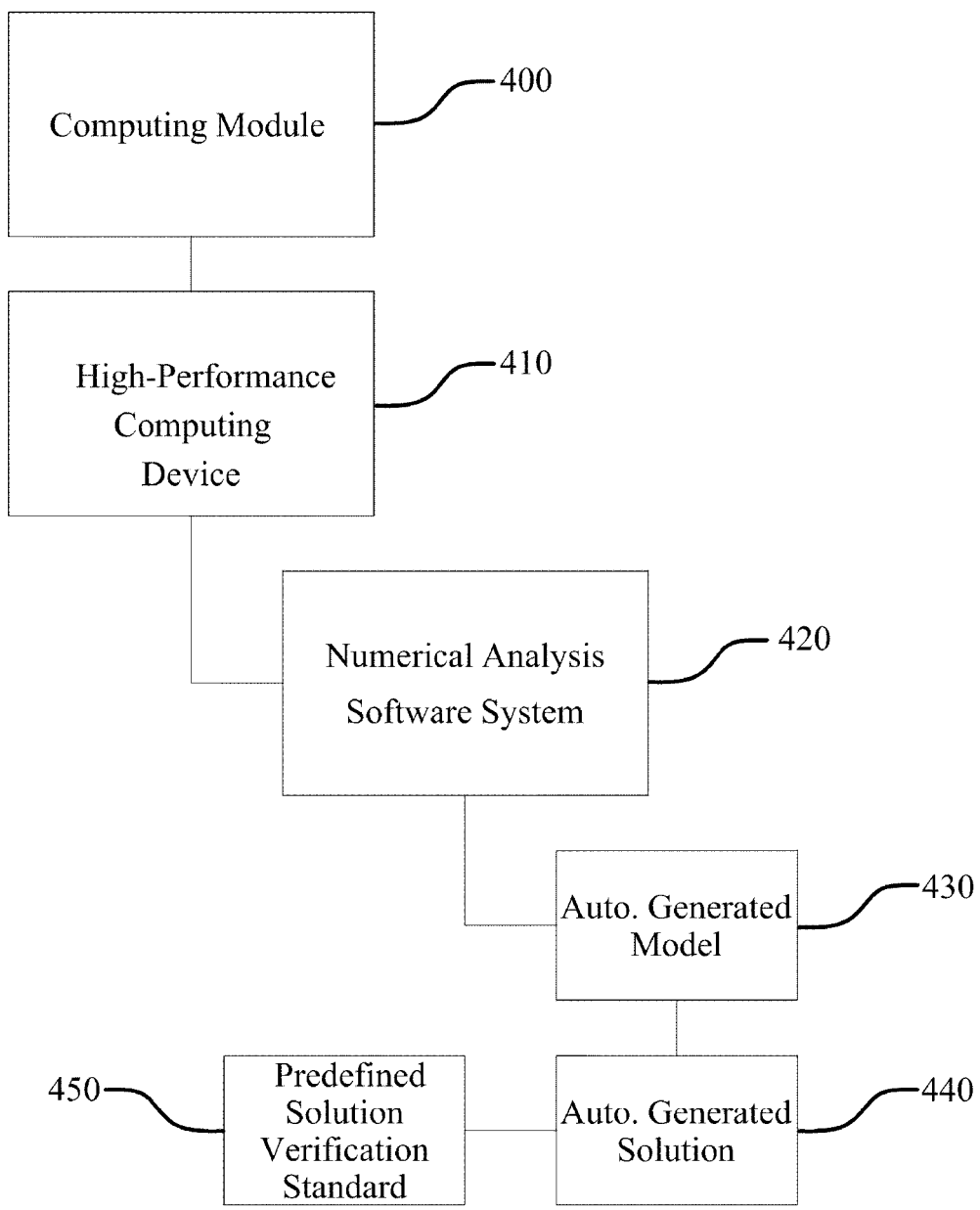
FIG. 3 is a schematic of one embodiment of the computing module of the present invention, not to scale.
Figure 4:
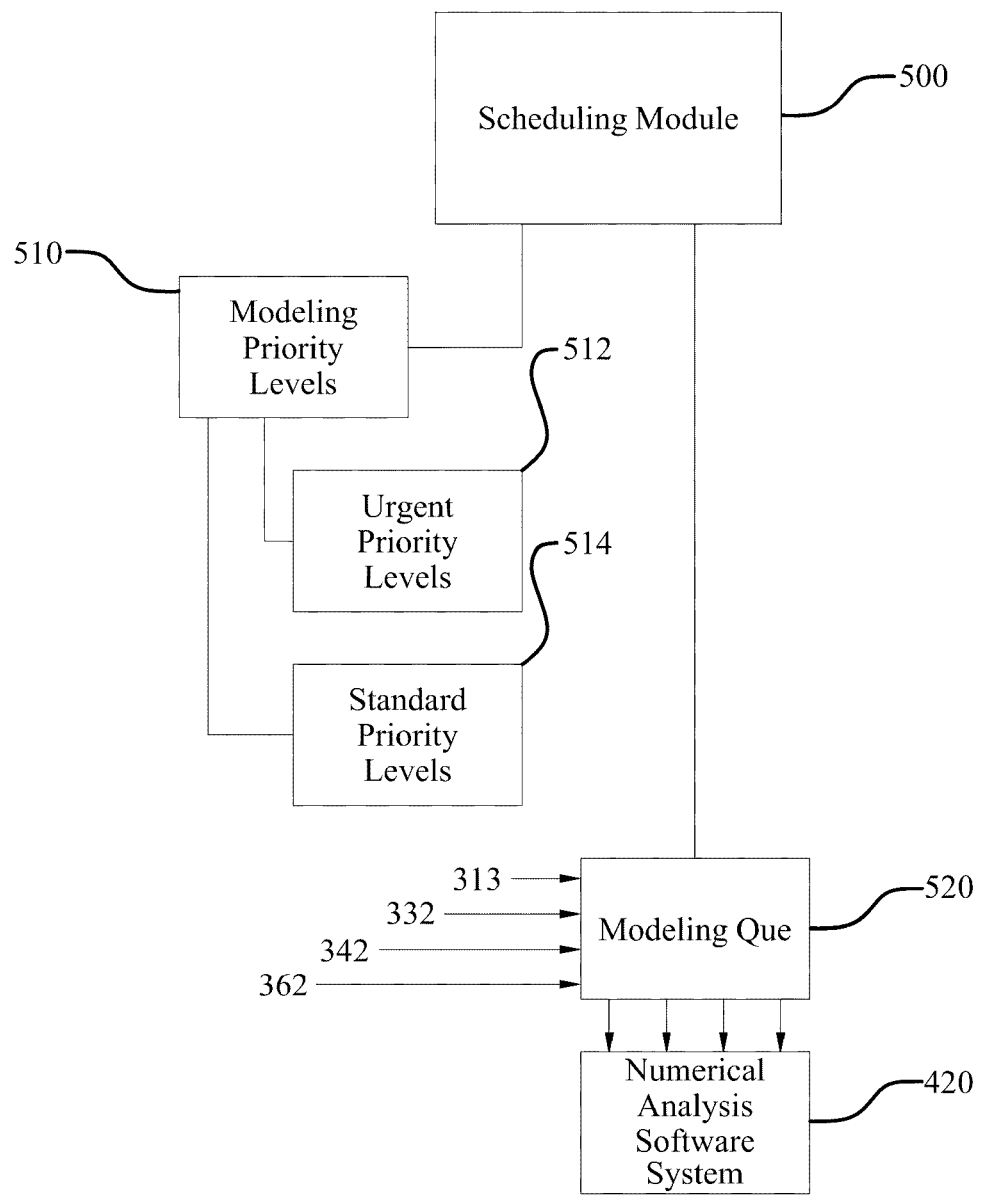
FIG. 4 is a schematic of one embodiment of the scheduling module of the present invention, not to scale.

First, as seen in FIG. 2, the joining methodology database (310) contains at least one joining method (312). For instance, the joining methodology database (310) contains a list of the types of joining processes that may be analyzed using the present invention. While the present invention need only include at least one joining method (312), it is anticipated that the joining methodology database (310) would include numerous joining methods. Such methods may include, but are not limited to, all types of fusion and solid-state welding including arc welding, oxyfuel gas welding, resistance welding, pressure welding, plasma welding, electron beam welding, electroslag welding, laser welding, ultrasonic welding, projection welding, laser additive manufacturing, thermite welding, explosion welding, pulsed narrow gap welding, and electromagnetic pulse welding, just to name a few.

Figure 10:
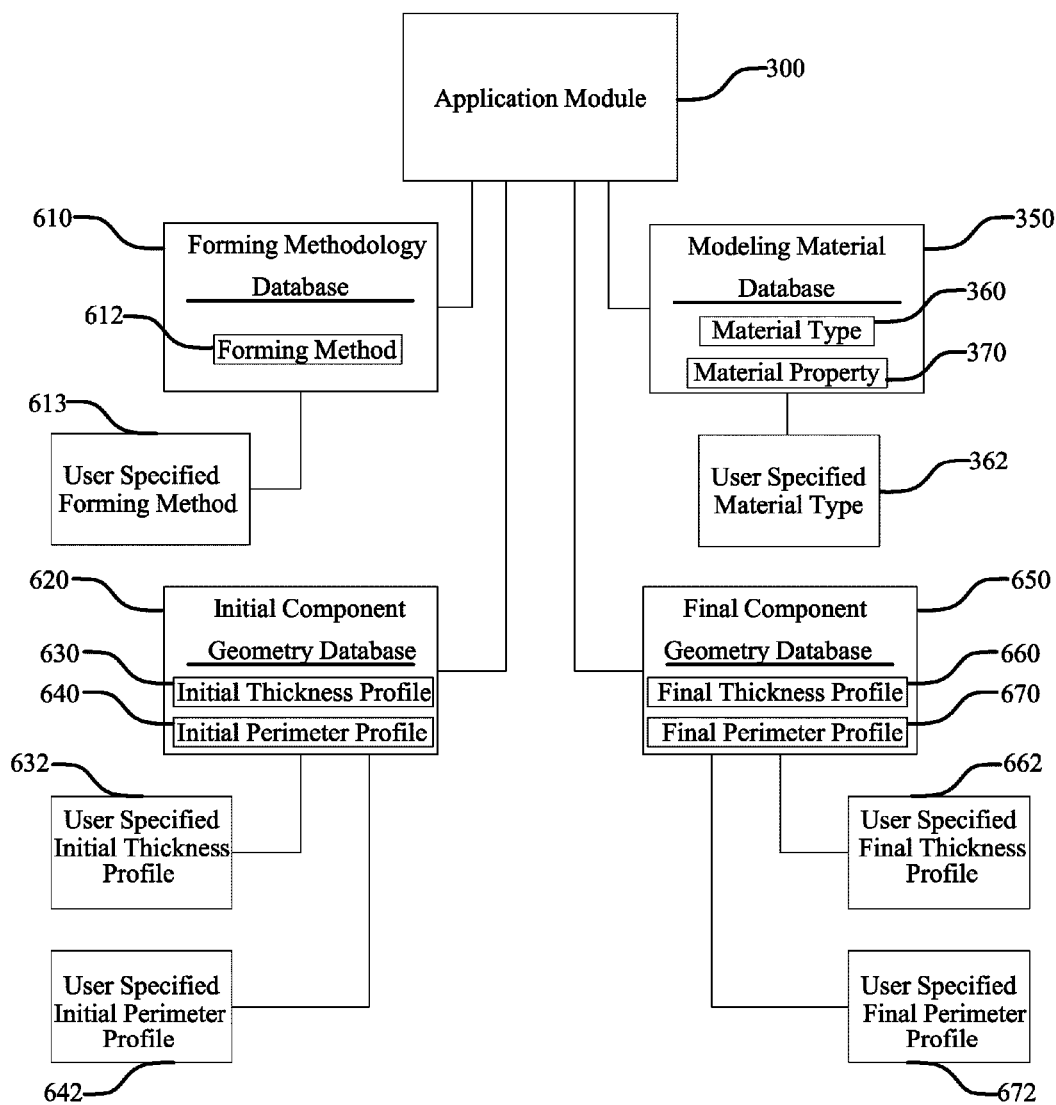
FIG. 10 is a schematic of one embodiment of the application module of the present invention, not to scale.

Similarly, as seen in FIG. 10 the forming methodology database (610) contains at least one forming method (612). For instance, the forming methodology database (610) contains a list of the types of material forming processes that may be analyzed using an embodiment of the present invention. While the present invention need only include at least one forming method (612), it is anticipated that the forming methodology database (610) would include numerous forming methods. Such methods may include, but are not limited to, all types of stamping, rolling, forging, extrusion, drawing, hydro forming, and thermal forming.

Figure 11:
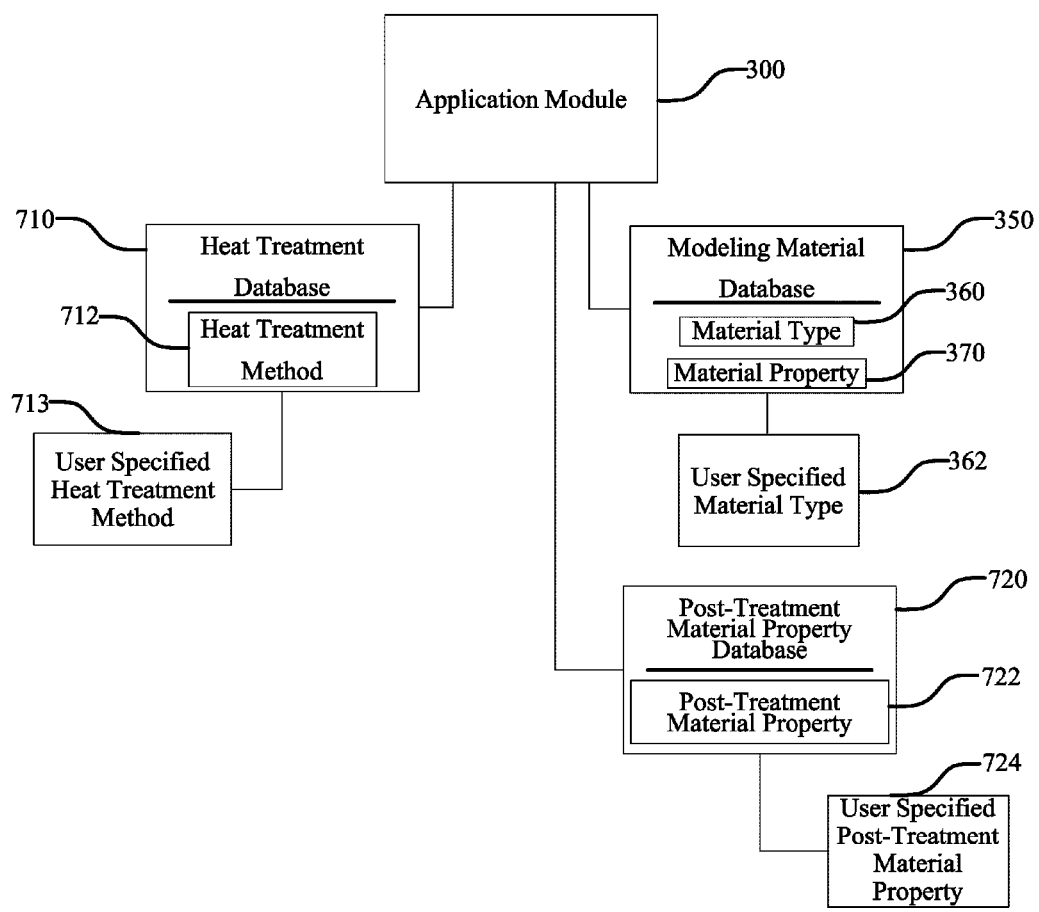
FIG. 11 is a schematic of one embodiment of the application module of the present invention, not to scale.

Likewise, as seen in FIG. 11, the heat treatment database (710) contains at least one heat treatment method (712). For instance, the heat treatment database (710) contains a list of the types of heat treatment process that may be analyzed using an embodiment of the present invention. While the present invention need only include at least one heat treatment method (712), it is anticipated that the heat treatment database (710) would include numerous heat treatment methods. Such methods may include, but are not limited to, all types of annealing, normalizing, hardening and tempering, and case hardening; including specialize heat treatment methods including, but not limited to, aging, solution heat treatment, quenching, full annealing, stress relief annealing, spheroidizing, conventional hardening and tempering, austempering, martempering, carburizing, cyaniding, nitriding, carbonitriding, physical vapour deposition, flame hardening, induction hardening, and high energy beam hardening, including, but not limited to, electron beam hardening and laser beam hardening.

Figure 12:
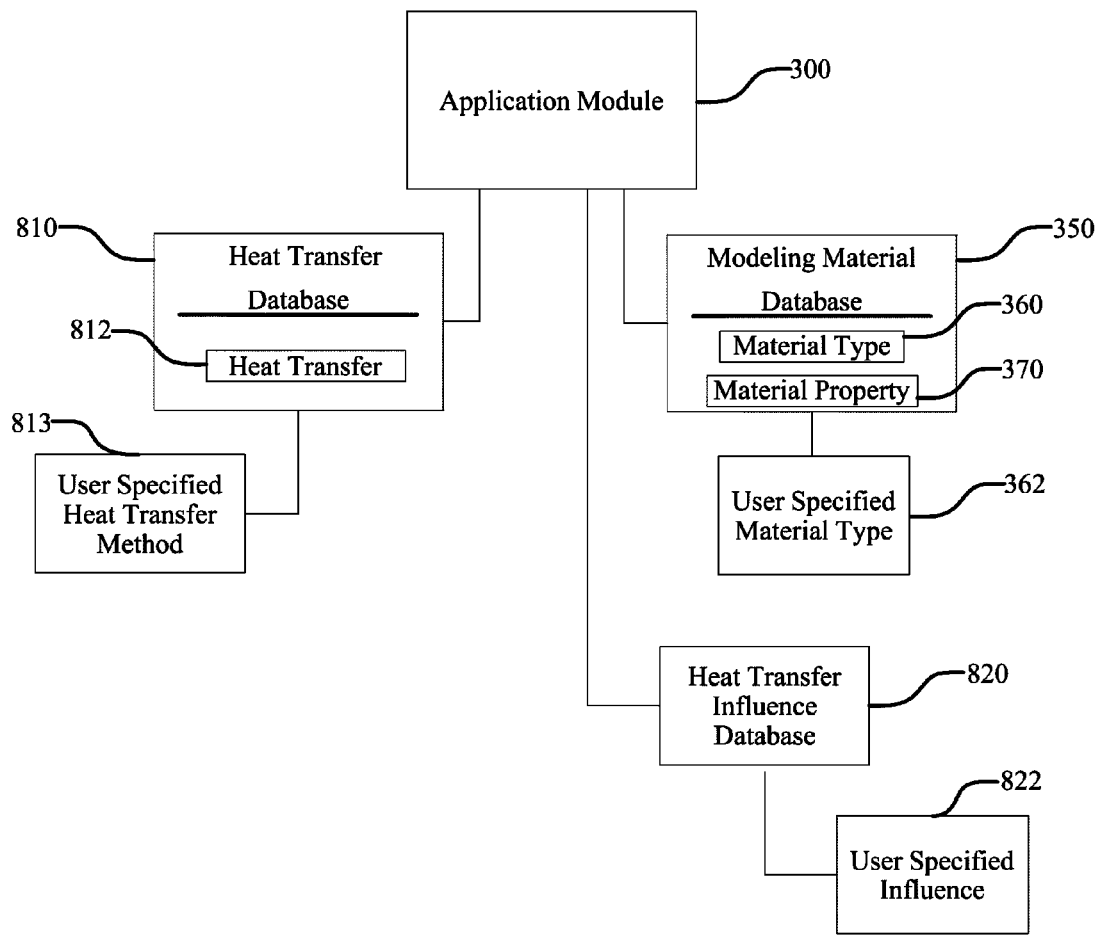
FIG. 12 is a schematic of one embodiment of the application module of the present invention, not to scale.

Likewise, as seen in FIG. 12, the heat transfer database (810) contains at least one heat transfer method (812). For instance, the heat transfer database (810) contains a list of the types of heat transfer process that may be analyzed using an embodiment of the present invention. While the present invention need only include at least one heat transfer method (812), it is understood that the heat transfer database (810) would include numerous heat transfer methods. Such methods may include, but are not limited to, all types of conduction, convection, and radiation. Further, this embodiment may include a heat transfer influencer database (820) including at least one user specified influencer (822). One skilled in the art will appreciated that a heat transfer influencer may be anything that changes the ideal transfer of heat, including, but not limited to, influencers such as ambient fluid, wind, heat sinks, insulators, radiation shields, and the like.

Figure 13:
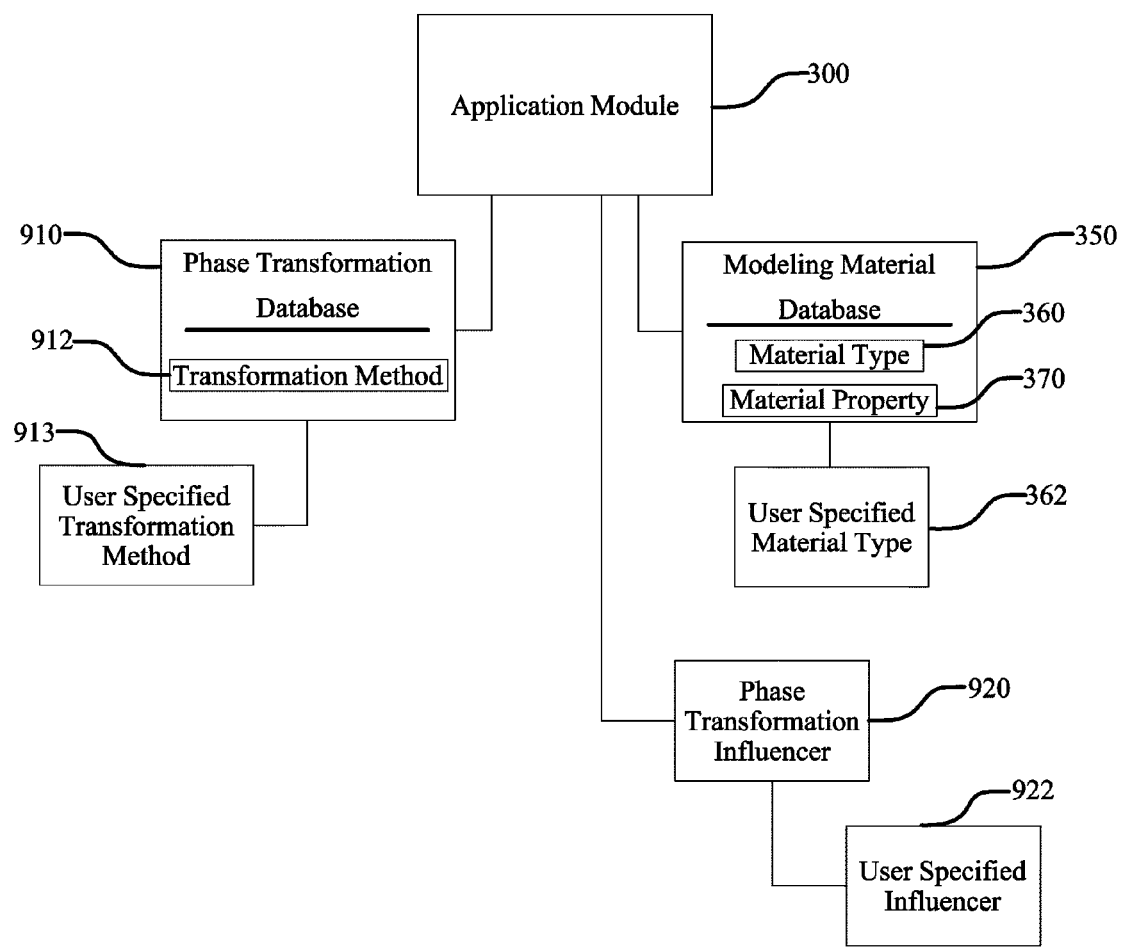
FIG. 13 is a schematic of one embodiment of the application module of the present invention, not to scale.

Further, as seen in FIG. 13, the phase transformation database (910) contains at least one phase transformation method (912). For instance, the phase transformation database (910) contains a list of the types of phase transformation process that may be analyzed using an embodiment of the present invention. While the present invention need only include at least one phase transformation method (912), it is understood that the phase transformation database (910) would include numerous phase transformation methods. Such methods may include, but are not limited to, all types of transformations among solids, liquids, gases, and plasmas. Further, this embodiment may include a phase transformation influencer database (820) including at least one user specified influencer (922). One skilled in the art will appreciated that the transformations include, but are not limited to, eutectic transformations, peritectic transformations, decomposition transformations, magnetic transformations, martensitic transformations, crystallographic structure changes, first-order phase transitions, and second-order phase transitions.

Figure 5:
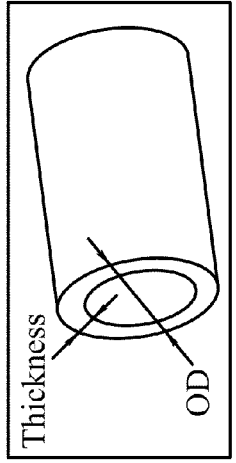
FIG. 5 is a screen shot of one embodiment of a portion of the present invention, not to scale.

Secondly, the joint geometry database (320) contains at least one joint type (330) and at least one joint profile (340). One skilled in the welding arts will appreciate the type of joints and variations of joint profiles compatible with each type of welding process previously mentioned. Some of the most common joint types include butt joints, lap joints, T-joints, and corner joints. One typical selection from the joint geometry database (320) is shown in FIG. 5 for a butt joint and a specific joint profile.

Similarly, the initial component geometry database (620) contains at least either an initial thickness profile (630) or an initial perimeter profile (640), but may contain both in some embodiments. One skilled in the material forming arts will appreciate the type of thickness profiles (630) and initial perimeter profiles (640) that may be contained in the initial component geometry database (620). For instance when the forming method (612) is a stamping operation then the material being formed may be a sheet of material having a uniform thickness and a conventional perimeter profile such as a rectangular, square, circular, oval, or the like. However, when the forming method (612) is a more complex process such as forging the component that is being forged may have incredibly complex thickness profile (630) and perimeter profile (640).

In a further embodiment the application module (300) also contains the final component geometry database (650) having at least either a final thickness profile (660) or a final perimeter profile (670), buy may contain both in some embodiments. The final thickness profile (660) and the final perimeter profile (670) represent desired geometric attributes of the component being formed upon completion of the forming operation.

Lastly, the modeling material database (350) contains at least one material type (360) and at least one material property (370). In other words, the modeling material database (350) contains a list of various material types (360), as well as the material property(s) (370) associated with the type of material. For instance, one embodiment of the invention may only include ferrous metals in the modeling material database (350), while another embodiment of the invention may only include exotic aerospace alloys in the modeling material database (350). Still further, the preferred modeling material database (350) would include essentially every material that may be joined by the welding processes included in the joining methodology database (310) or the forming processes included in the forming methodology database (610). It is important to note that modeling material database (350) is not limited to metallic materials but may include any type of material.

The application module databases (310, 320, 350, 610, 620, 650, 710, 720, 810, 820, 910, 920) may be customized for particular frequent remote users (10). For instance, remote users (10) doing work for the Navy may need a custom modeling material database (350) containing information unique to naval vessel fabrication applications. Alternatively, other organizations may often perform one type of unique joining method (312) or forming method (612) such that the application module databases (310, 320, 350, 610, 620, 650,

710, 720, 810, 820, 910, 920) may be tailored for the particular organization. Similarly, certain material forming processes always begin with a standard component and therefore default initial thickness profiles (630) and initial perimeter profiles (640) may be tailored for such standard components.

The material joining aspects of the present invention will be reviewed first in greater detail, followed by the material forming aspects. The operative communication between the interface module (200) and the application module (300) allows the remote user (10) to select a user specified joining method (313) from the at least one joining method (312) of the joining methodology database (310) for analysis. Further, the remote user (10) may select a user specified joint type (332) from the at least one joint type (330) of the joint geometry database (320) for analysis. Still further, the remote user may select a user specified joint profile (342) from the at least one joint profile (340) of the joint geometry database (320). Additionally, the remote user (10) may select a user specified material type (362) from the at least one material type (360) of the modeling material database (350). Thus, the remote user (10) may specify everything about the weld type, process parameters, joint type, and joint profile for the joining process that the remote user (10) wishes to analyze.

The preferred embodiment of the present invention is interactive, meaning that the selection by the remote user (10) of a first user specified application criteria (301) from the user specified joining method (313), the user specified joint type (332), the user specified joint profile (342), or the user specified material type (362) causes the application module (300), influences the available options for the user to select a second user specified application criteria (302). In other words, once the remote user (10) selects the first user specified application criteria (301) then the application module (300) to access the application qualification standard (390) and the application qualification standard (390) limits the selection available to the remote user (10) for a second user specified application criteria (302) from the at least one joining method (312), the at least one joint type (330), the at least one joint profile (340), and the at least one material type (360) based upon the first user specified application criteria (301). This ensures that a novice remote user (10) cannot select criteria that cannot be analyzed.

For example, prior to accessing the screen shown in FIG. 5 the remote user (10) has already selected the user specified joining method (313) and the user specified joint type (332), namely a pipe butt joint. Therefore, these selections have already caused the application module (300) to access the application qualification standard (390) and limit the selection available to the remote user (10) for user specified material type (362) and the user specified joint profile (342). Thus, a novice remote user (10) could not select a user specified material type (362) that is inconsistent with the previously selected user specified joining method (313). Likewise, the novice remote user (10) could not select a user specified joint profile (342) that is inconsistent with the previously selected user specified joint type (332). It is the application qualification standard (390) that guides the remote user (10) through selections that are consistent with previous selections.

Figure 6:
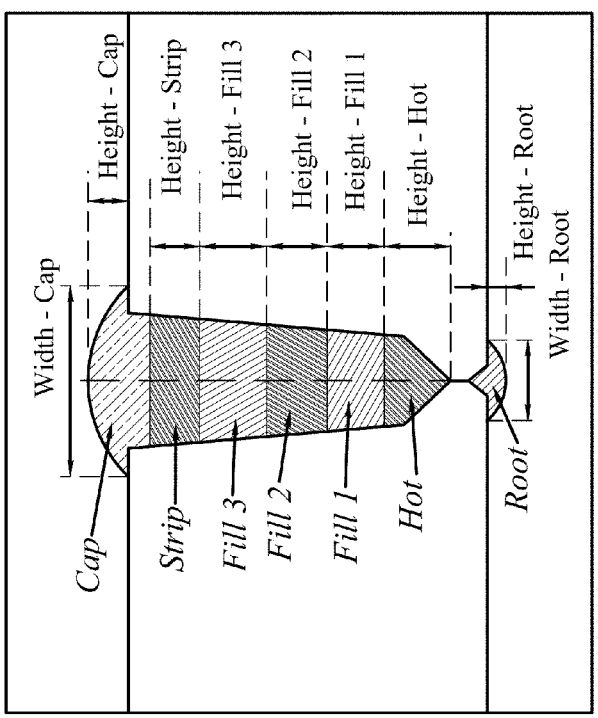
FIG. 6 is a screen shot of one embodiment of a portion of the present invention, not to scale.

Thus, in the example of FIGS. 5 and 6, the remote user (10) has already specified the user specified joining method (313) as being pulsed narrow gap welding before getting to the selections presented in FIGS. 5 and 6. Further, the default joining method process parameters seen in FIG. 6 have been adjusted by the application qualification standard (390) in light of the user specified joining method (313), the user specified joint type (332), the user specified joint profile (342), and the user specified material type (362). For instance, if the remote user (10) had selected a solid state joining process such as friction stir welding for the user specified joining method (313) then the default joining method process parameters seen in FIG. 6 would be totally different, as would the default joint profile parameters seen in FIG. 5. A further illustration of this "guidance of the novice" concept is seen by the fact that the system (100) determines a starting point for the number of passes for the weld profile defined in FIGS. 5 and 6. The process specification may include such variables as welding current, voltage, wire feed speed (WFS), weld bead size, travel speed, pin load, should load, travel axis load, rpm, electrode characteristics, FSW tool characteristics, and the like. The present invention is not limited to "guidance of the novice" applications but may also be effectively used by experienced engineers to dramatically reduce the time spent on repetitious work in numerical analysis including weld geometry creation, meshing, and report generation.

Now, looking with greater emphasis at the material forming aspects of the present invention, the operative communication between the interface module (200) and the application module (300) allows the remote user (10) to select a user specified initial thickness profile (632) from the initial component geometry database (620), a user specified initial perimeter profile (642) from the initial component geometry database (620), a user specified final thickness profile (662) from the final component geometry database (650), and/or a user specified final perimeter profile (672) from the final component geometry database (650), for analysis. One skilled the material forming arts will appreciate that there are situations in which it is desirable to specify attributes of the final component, versus specifying attributes of the initial component. Thus, the remote user (10) may specify everything about the forming type, forming process parameters, and component geometry attributes (both initial and final) for the forming process that the remote user (10) wishes to analyze.

The preferred embodiment of the present invention is interactive, meaning that the selection by the remote user (10) of a first user specified application criteria (301) from the user specified forming method (613), the user specified initial thickness profile (632), the user specified initial perimeter profile (642), the user specified final thickness profile (662), the user specified final perimeter profile (672), or the at least one material type (360) causes the application module (300), influences the available options for the user to select a second user specified application criteria (302). In other words, once the remote user (10) selects the first user specified application criteria (301) then the application module (300) accesses the application qualification standard (390) and the application qualification standard (390) limits the selection available to the remote user (10) for a second user specified application criteria (302) to the user specified forming method (613), the user specified initial thickness profile (632), the user specified initial perimeter profile (642), the user specified final thickness profile (662), the user specified final perimeter profile (672), or the at least one material type (360) based upon the first user specified application criteria (301). This ensures that a novice remote user (10) cannot select criteria that cannot be analyzed.

In further embodiments the remote user (10) may contribute to the initial component geometry database (620) and/or the final component geometry database (630). Such contributions, like the thickness profiles (630, 660) and the perimeter profiles (640, 670), may be in the form of computer aided design files. Thus, once the physical structure of a components is modeled using any number of computer aided design tools then the associated file may simply be uploaded to this embodiment of the present system (100) for extraction of the relevant thickness profiles (630, 660) and/or the perimeter profiles (640, 670). For example, many different golf club head iron designs are forged using a common material size and shape as the starting point. Thus, the initial size and shape may be used to establish the initial thickness profile (630) and the initial perimeter profile (640). Further, the computer aided design file representing the physical geometry of the final club head may be uploaded for extraction of the final thickness profile (660) and final perimeter profile (670). Therefore, the system (100) is using information that the remote user (10) already has created for other purposes, thus further saving time and money. As one skilled in the art will appreciate, this is just one example of the thousands of similar applications that will benefit from the present invention. Thus, the system (100) may include industry specific databases containing libraries of geometric profiles that are commonly used in that industry. For example, an automotive library may contain all of the standard materials, gauges, and sizes that are commonly used in created automotive skins, or panels.

In yet a further embodiment, the system (100) allows the remote user (10) to create or select the material forming process variables, which are known to those skilled in the material forming arts. Further, forming equipment manufacturers may contribute the forming process variables that are associated with their equipment so that the remote user (10) may actually select the model of forming equipment that will be used thereby establishing a predetermined range of values for the material forming process variables. For instance, a very simplistic example of this would be the remote user's (10) ability to select the model of forge that is available to them in their manufacturing process with that particular selection then automatically limiting the material forming process variables that the remote user (10) may select or enter. Thus, the remote user (10) could not enter a forging load greater than that which is capable of the selected piece of equipment. In a further embodiment the forming equipment manufacturers that contribute to this database would be given credit for such contributions that the manufacturer may then use to access other attributes of the system (100).

Now moving on to the computing module (400), the computing module (400) receives the user specified joining method (313), the user specified joint type (332), the user specified joint profile (342), and the user specified material type (362), in the case of a material joining embodiment. This transfer of user specified data to the computing module (400) is regulated by a modeling queue (520) as will be discussed later in detail. The computing module (400) controls the transfer the user specified joining method (313), the user specified joint type (332), the user specified joint profile (342), and the user specified material type (362) to a high-performance computing device (410) having a numerical analysis software system (420). Alternatively, in the case of a material forming embodiment the computing module (400) receives the user specified forming method (613), the user specified initial thickness profile (632), the user specified initial perimeter profile (642), the user specified final thickness profile (662), or the user specified final perimeter profile (672), as well as the user specified material type (362). Likewise, in the case of a heat treatment embodiment the computing module (400) receives the user specified heat treatment method (713), and the user specified post-treatment material property (724), as well as the user specified material type (362). Similarly for the heat transfer embodiment and the phase transformation embodiment.

In the case of a material joining embodiment, the numerical analysis software (420) is configured to receive the user specified joining method (313), the user specified joint type (332), the user specified joint profile (342), and the user specified material type (362), and automatically create an automatically generated model (430) directly related to the previously selected user parameters. This step is significant because it takes complex step of creating a finite element analysis model away from the novice remote user (10). The automatically generated model (430) is created based upon the user specified criteria (313, 332, 342, 362) without the need for any finite element analysis (FEA) knowledge on the part of the remote user (10). Similarly, in the case of a material forming embodiment the numerical analysis software (420) is configured to receive the user specified forming method (613), the user specified material type (362), and at least one piece of user specified geometry data selected from the group of the user specified initial thickness profile (632), the user specified initial perimeter profile (642), the user specified final thickness profile (662), or the user specified final perimeter profile (672). The numerical analysis software (420) then automatically creates an automatically generated model (430) directly related to the previously selected user parameters.

The numerical analysis software (420) also automatically creates an automatically generated solution (440) using the computing power of the high-performance computing device (410), which in one embodiment is a supercomputing device. The present inventions use of the high-performance computing device (410) reduces solution run time from as high as 8 hours per simulation down to minutes. Incorporation of the high-performance computing device (410) allows remote users (10) access to distant high-performance computing resources without the need for the expertise and expense typically associated with accessing high-performance computing power. Upon generation of the solution (440), the computing module (400) compares a portion of the automatically generated solution (440) with a predefined solution verification standard (450). This comparison allows the computing module (400) to recognize solutions (440) that are likely to contain errors. If the automatically generated solution (440) satisfies the predefined solution verification standard (450) then the computing module (400) automatically transmits the automatically generated solution (440) to the interface module (200) for display to the remote user (10).

As one skilled in the art will appreciate, the meaning of a high-performance computing device (410) changes with every passing year. The term high-performance computing device (410) is used herein to mean a computing device having at least 5 times the computing power of the average then currently available personal computer. Thus, in April 2007 the average then currently available personal computer has a computing power characterized by the following component capabilities: Intel® Core™ 2 Duo Processor E6400 (2 MB L2 Cache, 2.13 GHz, 1066), 1 GB Dual Channel DDR2 SDRAM at 667 MHz—2 DIMMs, 250 GB Serial ATA 3 Gb/s Hard Drive (7200 RPM) w/DataBurst Cache™, and 256 MB nVidia Geforce 7300LE TurboCache video card. In one particular embodiment the high-performance computing device (410) is a supercomputing device. The term supercomputer itself is rather fluid, and today's supercomputer tends to become tomorrow's normal computer. Early supercomputing devices were simply very fast scalar processors, some ten times the speed of the fastest machines offered by other companies. In the 1970's most supercomputers were dedicated to running a vector processor, and many of the newer players developed their own such processors at a lower price to enter the market. The early and mid-1980's saw machines with a modest number of vector processors working in parallel become the standard. Typical numbers of processors were in the range 4-16. In the later 1980's and 1990's, attention turned from vector processors to massive parallel processing systems with thousands of "ordinary" CPUs, some being off the shelf units and others being custom designs. Today, parallel designs are based on "off the shelf" server-class microprocessors, such as the PowerPC, IA-64, or x86-64, and most modern supercomputers are now highly-tuned computer clusters using commodity processors combined with custom interconnects. The present inventions reference to supercomputing device (410) means a computer having the capabilities of at least those of a CRAY X1 computer system having a powerful parallel vector processor (PVP) supercomputer that features 16 (800 MHz) Multi Streaming vector processors and 128 Gbytes of physical RAM for large simulations. Each MSP processor contains four internal processors called Single Streaming Processors (SSP). The SSPs are 800 MHz vector processors and applications can be compiled to run on individual SSPs if desired. Thus, the supercomputing device (410) of the present application has an approximate peak performance of 204.8 Gflops (3.2 Gflops per SSP processor) (12.8 Gflops per MSP processor). The requirement for the number of processors and speed can be increased depending upon the needs of the remote user (10). The present invention allows for continued advances in processor design and speed.

Lastly, the discussion turns to the scheduling module (500). The scheduling module (500) incorporates at least two modeling priority levels (510), including at least an urgent priority level (512) and a standard priority level (514), and a modeling queue (520). The modeling queue (520) receives, prioritizes, and stores the user specified joining method (313), the user specified joint type (332), the user specified joint profile (342), and the user specified material type (362), and modeling queue (520) controls the transfer of this user specified data (313, 332, 342, 362) to the numerical analysis software system (420), in the embodiments directed to material joining. Whereas in the embodiments directed to material forming the modeling queue (520) receives, prioritizes, and stores the user specified forming method (613) and the user specified material type (362), as well as at least one of the user specified component geometry attributes selected from the group including the user specified initial thickness profile (632), the user specified initial perimeter profile (642), the user specified final thickness profile (662), or the user specified final perimeter profile (672), and modeling queue (520) controls the transfer of this user specified data (313, 332, 342, 362) to the numerical analysis software system (420). Therefore, the modeling queue (520) essentially controls when the high-performance computing device (410) is dedicated to solving particular solutions (440).

The remote user (10) selects the urgent priority level (512) or the standard priority level (514) based upon how quickly the remote user (10) needs the solution (440). The modeling queue (520) then prioritizes the order of projects and transmits the user specified data to the numerical analysis software (420). The modeling queue (520) may further prioritize the order of projects based upon estimated runtime and as well as preferred rate structures for utilization of off-peak supercomputing resources. In other words, if the solution may be computed during off-peak hours then the remote user may receive a lower price than if the analysis must be immediately modeled.

Finally, the interface module (200) receives the automatically generated solution (440) from the computing module (400) and displays it to the remote user (10). At this stage the system (100) may also prompt the remote user (10) as to whether they would like the solution (440) experimentally validated. If the remote user (10) would like the solution (440) experimentally validated then the system (100) may automatically generate a proposal for the experimental validation based upon the input of the remote user (10). A further embodiment incorporates a validation database containing welding procedures of material joining processes that have had the automatically generated solution (440) experimentally validated.

In a further embodiment of the present invention the numerical analysis software system (420) is located on the high-performance computing device (410) and consists of finite element analysis (FEA) software. In this embodiment the automatically generated model (430) consists of a finite element mesh that represents the data input by the remote user (10). The numerical analysis software system (420) then solves the system and yields the automatically generated solution (440). The high-performance computing device (410) of the present invention facilitates one embodiment in which the meshing simulation, the thermal simulation, and the stress simulation are always created and solved. In fact, in further embodiments modeling of the distortion and microstructure are always performed. The system (100) may be used to predict thermal and stress cycles as a function of geometry, process, process parameters, and time. Further, the system (100) may be used to relate thermal cycles and composition of parts to underlying phases and their fractions. Even further, the system (100) may integrate the process and microstructure models to calculate the performance of structures as a function of static, dynamic, and fatigue loading conditions at different temperatures.

The solution (440) may include a graphic display of the maximum temperature achieved in different locations within the weld and the adjacent material. Additionally, the solution (440) may provide a graphical illustration of the extent of reheating of the weld material as well as the base material. Such illustrations may be further accompanied by graphs of the thermal cycles at various locations in the weld, as well as the cooling rates at various locations in the weld, seen in FIG. 9. The solution (440) may also include detailed microstructure data including, but not limited to, graphical illustrations of the distribution of ferrite, bainite, and martensite in the weld. The microstructure, cooling rate, and composition may be further utilized to illustrate other post joining properties such as the distribution of Vickers hardness in the weld region. The stress analysis portion of the solution (440) may include a residual stress and distortion analysis including the distribution of von mises stresses, residual stresses, and distortion. Further, unique solutions (440) related to material forming modeling, including predicting spring back, wrinkling, cracking, and hardening. The solution (440) may further include fatigue analysis.

The present invention provides the guidance and validation that novice users need to correctly simulate a joining process. Further, the present invention may be implemented over the internet allowing worldwide access to guided and monitored solutions to complex joining, forming, heat treatment, heat transfer, and phase transformation FEA problems solved using high-performance computing resources. Thus, the present invention eliminates the need for the substantial investment typically required in acquiring modeling software, developing expertise in using the software and modeling techniques, and the high performance computing hardware generally required to operate such modeling software.

The present invention also includes a method for remotely modeling a material joining process using high-performance computing means that enables a remote user (10) using a user input device (20) to use high speed computing capabilities to model materials joining processes. The method comprising:

(A) selecting a first user specified application criteria (301) from:
  (i) a user specified joining method (313) from a joining methodology database (310) containing at least one joining method (312);
  (ii) a user specified joint type (332) from a joint geometry database (320) having at least one joint type (330);
  (iii) a user specified joint profile (342) from a joint geometry database (320) having from the at least one joint profile (340); or
  (iv) a user specified material type (362) from a modeling material database (350) containing at least one material type (360) and at least one material property (370);

(B) comparing an application qualification standard (390) with the first user specified application criteria (301) and limiting the selection of a second user specified application criteria (302) from (i), (ii), (iii), or (iv) that is consistent with the first user specified application criteria (301);

(C) transferring the user specified joining method (313), the user specified joint type (332), the user specified joint profile (342), and the user specified material type (362) to a modeling queue (520);

(D) selecting a modeling priority level (510) from at least an urgent priority level (512) and a standard priority level (514);

(E) transferring the user specified joining method (313), the user specified joint type (332), the user specified joint profile (342), and the user specified material type (362) from the modeling queue (520) to a numerical analysis software system (420) resident on a high-performance computing device (410) based upon the modeling priority level (510);

(F) creating an automatically generated model (430);

(G) creating an automatically generated solution (440) using the computing power of the high-performance computing device (410); and (H) comparing a portion of the automatically generated solution (440) with a predefined solution verification standard (450) and displaying a portion of the automatically generated solution (440) if the automatically generated solution (440) satisfies the predefined solution verification standard (450).

In yet another embodiment the present invention also includes a method for remotely modeling a material forming process using high-performance computing means that enables a remote user (10) using a user input device (20) to use high speed computing capabilities to model materials forming processes. The method comprising:

(A) selecting a first user specified application criteria (301) from:
  (i) a user specified forming method (613) from a forming methodology database (610) containing at least one forming method (612);
  (ii) a user specified initial thickness profile (632) from a initial component geometry database (620) having at least initial thickness profile (630);
  (iii) a user specified final thickness profile (662) from a final component geometry database (650) having at least final thickness profile (660);
  (iv) a user specified initial perimeter profile (642) from a initial component geometry database (620) having at least initial perimeter profile (640);
  (v) a user specified final perimeter profile (672) from a final component geometry database (650) having at least final perimeter profile (670); or
  (vi) a user specified material type (362) from a modeling material database (350) containing at least one material type (360) and at least one material property (370);

(B) comparing an application qualification standard (390) with the first user specified application criteria (301) and limiting the selection of a second user specified application criteria (302) from (i), (ii), (iii), (iv), (v), or (vi) that is consistent with the first user specified application criteria (301);

(C) transferring the user specified forming method (613), the user specified initial thickness profile (632), the user specified initial perimeter profile (642), the user specified final thickness profile (662), the user specified final perimeter profile (672), and the user specified material type (362) to a modeling queue (520);

(D) selecting a modeling priority level (510) from at least an urgent priority level (512) and a standard priority level (514);

(E) transferring the user specified forming method (613), the user specified initial thickness profile (632), the user specified initial perimeter profile (642), the user specified final thickness profile (662), the user specified final perimeter profile (672), and the user specified material type (362) from the modeling queue (520) to a numerical analysis software system (420) resident on a high-performance computing device (410) based upon the modeling priority level (510);

(F) creating an automatically generated model (430);

(G) creating an automatically generated solution (440) using the computing power of the high-performance computing device (410); and (H) comparing a portion of the automatically generated solution (440) with a predefined solution verification standard (450) and displaying a portion of the automatically generated solution (440) if the automatically generated solution (440) satisfies the predefined solution verification standard (450).

The remote high-performance computing material joining and material forming modeling system (10) increases accessibility for FEA applications and provides a remote online portal for engineering domain knowledge, software knowledge, and hardware access. The system (10) reduces the complexity of using FEA tools for industrial manufacturing by providing internet access. The present invention allows the remote user (10) to focus on the engineering solution rather than expensive and time-consuming technology development exercise associated with FEA modeling from scratch.

Figure 7:
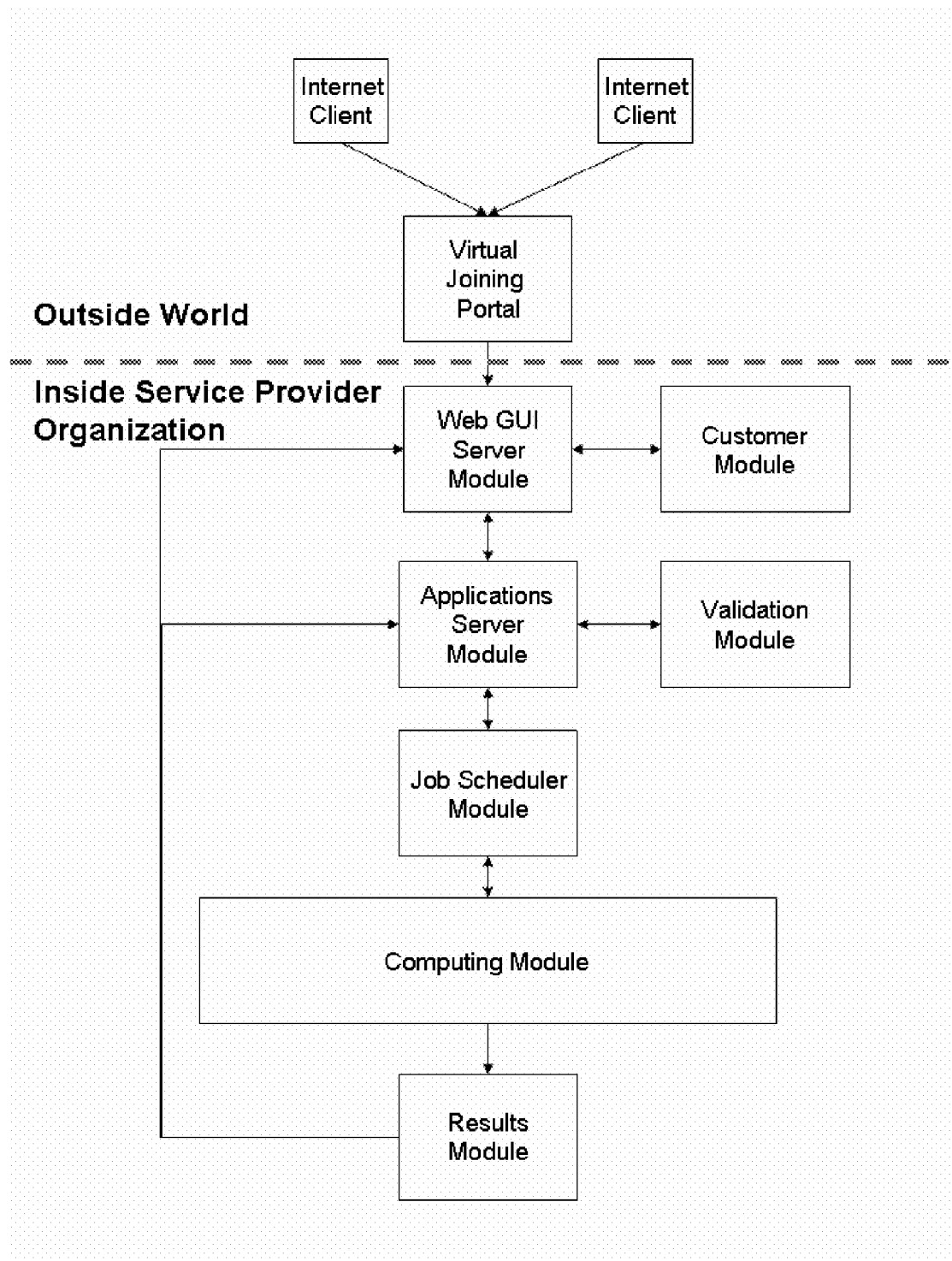
FIG. 7 is a schematic of one embodiment of the present invention, not to scale.
Figure 8:
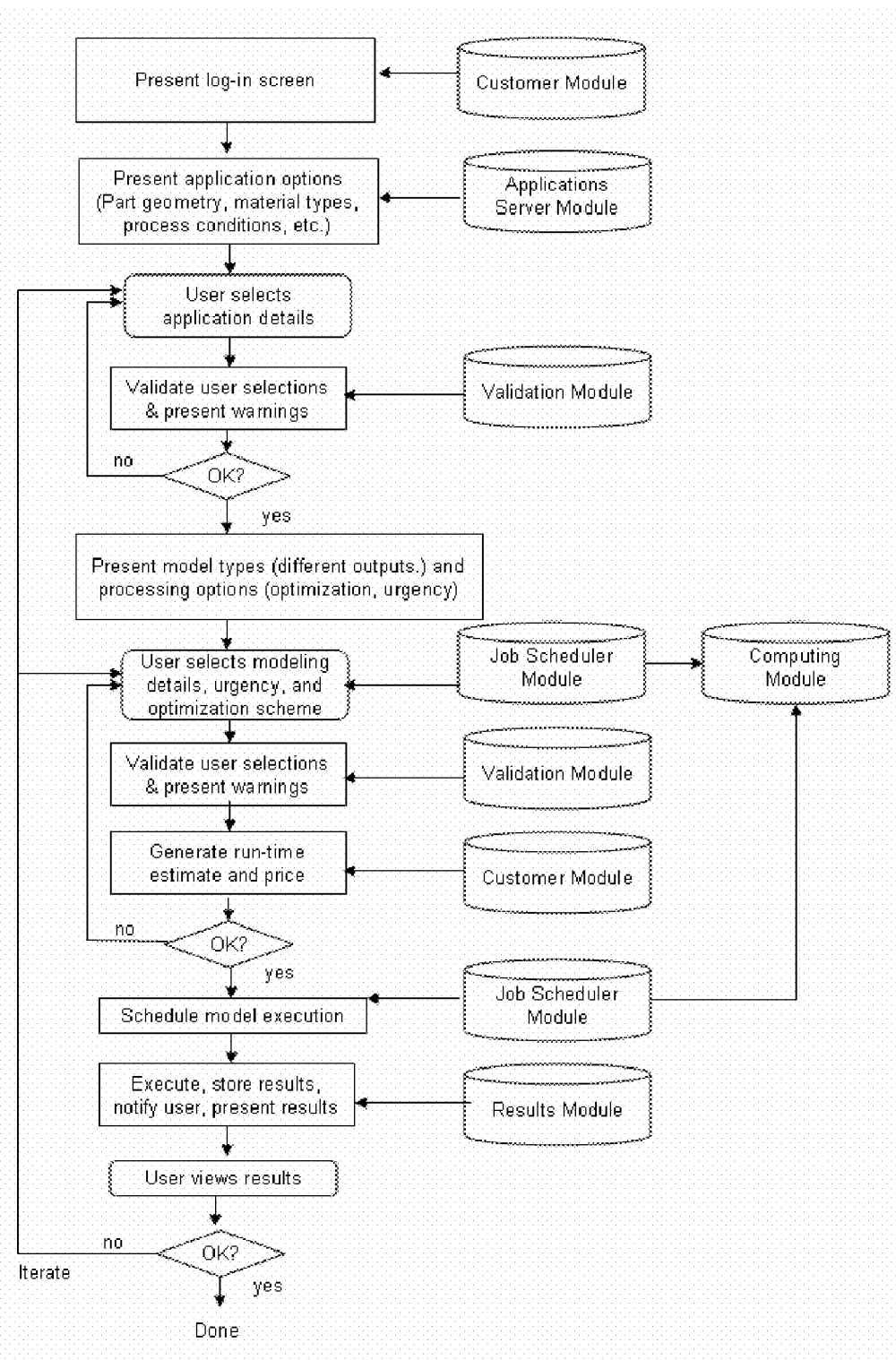
FIG. 8 is a schematic of one embodiment of the present invention, not to scale.

FIGS. 7 and 8 illustrate further embodiments of the present invention. The various aspects of FIGS. 7 and 8 will be described below.

The present invention combines several technologies and methods, in an innovative way, to improve usability, performance, speed and operability of predictive modeling tools. Components of the invention are provided below. Simplified user interface designed for operation by novice users; guidance and validation of user entries based on prior results and expertise stored in a relational database; automatic meshing and model execution, eliminating the need for finite element analysis (FEA) and manufacturing modeling expertise; predictive weld modeling, including options for prediction of weld geometry, thermal cycles, microstructure, properties, residual stress, distortion, or process parameters; predictive material forming modeling, including options to predict spring back, wrinkling, cracking, and hardening; web-deployment, allowing access from any computer via a standard internet connection and web browser, eliminating the need for an investment in modeling software installation on the client computer as well as the need for high-performance computing hardware, wherein such access includes, but is not limited to, access via personal computer, networked computer, and personal digital assistants; high performance computing to reduce the model execution time; optional automated optimization to meet user-selected requirements, reducing need for user to perform iterative calculations to converge on the desired solution; job execution scheduling based on user-identified urgency; price calculation based on user-selected model types and urgency; automatic analysis report generation; and automatic notification when job execution has been completed.

FIG. 7 illustrates the major functional components of this embodiment of the present invention. A typical sequence of operation to be performed to meet the needs of a remote user in this embodiment is illustrated in FIG. 8. A description of each module is presented below.

In this embodiment the Web GUI Server Module provides the remote user's entry into virtual joining portal service. Following actions may be pre-programmed in this module: secure access to services through password protection; list of all the available application services; customizable framework for application listing and brand-name customization; provide an overview of the status of the joining portal including availability, current loads, expected time of completion for different jobs, announcements of new services relevant to the portal, and partnership agreements with third party providers. In this embodiment the Customer Module may maintain all the interactions with remote user. This module may perform the following: tracking of financial information including status of annual/monthly/weekly membership status, cost incurred, credit card processing; usage logs including users, extent of use, and type of applications used; technical information including provide access to database of material joining and forming data, list of reports generated, and list of errors reports; repository of data and reports generated in the past including storage of input file, storage of calculation data (raw file), storage of reports (processed output); support pages pertaining to each organization including training documents including video and audio training files and frequently asked questions.

In this embodiment the Application Module access to different application modules that can be used by the remote user. This module may have two components, i.e. generic and customized. The Generic Module will be common to all the customers and may provide basic tools for wide range of joining processes, different geometry classes, and commonly available materials. The validations for these modules are based on the pre-existing literature. The Customized Module will be a tailored version of the generic module. The modules may have modifications proprietary to the remote user's organization. The validations of these modules are based on data currently available or to be generated by the remote user's organization. The access to the customized version will be restricted to the organization or group of organizations funded development of the customized version. Both the modules may perform the following: maintain a database of available applications; provide details of the input (geometry, material and process parameters); provide an overview of the expected results; provide access to the validation and job scheduler modules; provide an overview of the usability of these modules different class of problems; process model to predict thermal, electrical, and stress cycles as a function of geometry, process, process parameters, and time; microstructure model to relate thermal cycles and composition of the parts to underlying phases, fractions, and morphology; performance models that integrate the process and microstructure models to calculate the performance of structure as a function of static, dynamic and fatigue loading conditions at different temperatures.

Further, in this embodiment the Validation Module provides access to the detailed reports, papers, and presentations of the validation exercises performed on different applications. For example, a distortion prediction module validation may show the measured distortion and predicted distortions as a function of different materials and process combinations. The module may provide the following: upper and lower bounds of input parameters for each module; expected accuracy of prediction for different applications; provide examples of successful usage based on customer and open literature; provide guidance for appropriate usage of the tools; provide detailed methodology of validation methodologies; distortion evaluation; residual stress measurements; microstructure characterization; static and dynamic mechanical properties; and provide available resources and costs for experimental validation exercises.

In this embodiment the Job Scheduler Module couples program management, business functions, and technical computing needs. This module may: provide real-time feedback of the launching of application, execution of application and also report generation; evaluate the customer needs and provide possible approaches including alternatives (supercomputing, remote desktop, or analytical approaches); calculate the run-time pricing; availability of computing resources; urgency of solution for the customer; resource requirement for each application; expected time of completion and usage scenarios; obtain customer's approval to run the applications; interact with customer modules to charge out the cost; schedule the task, result generation and delivery of results to the customers; and generate error and support messages based on the execution of results.

To perform the above tasks, the job scheduler will use the computational and results modules. In this embodiment the Computational Module performs all the numerical calculations and may use, but is not limited to, the three different methodologies listed below.

In this embodiment the one particular methodology is carried out by the Super Computing Module. Certain FEA analysis will require the use of supercomputing architecture to provide rapid solutions. The scheduler will handle the high performance computing architecture that may be available in third party organizations. A second methodology is carried out via the Remote Desktop Computing Module, in which some of the FEA applications will be accessed using remote desktop methodology. Lastly, a third methodology is carried out by the Simple Analytical Module. This methodology is limited to certain cases in which, based on the cost and time, the customer may choose analytical tools. These tools are based on published models in the literature. This module may perform anyone of the following based on needs of the remote user: empirically based predictions using information from application joining or forming databases; neural net models based on exhaustive FEA calculations; neural net models based on experimental data; simple phenomenological models based on published data; simple statistical models based on fusion of modeling and experimental data; in this embodiment the Results Module performs both the functions of buffering the results as well as processing the results relevant to the remote user's needs. In addition, the decision to user buffer module or by-pass this module, will be directed by the Job-scheduler depending upon the urgency criteria defined by the remote user.

In this embodiment the Results Buffer Module will be used to store extensive amount of FEA calculations and may perform the following: store results for individual run until the report is generated; and delete the results based on the customer module requirements.

Further, in this embodiment the Results Module converts the results from the calculations into a form readable by the remote user and may perform the following: automatic analysis and reporting tools; customized lay-out of the report for each class of problems; guides to translate the results to usable form for field welding knowledge.

FIG. 8 illustrates a typical usage scenario for this embodiment. It is important to note that the following sequence is not fixed for all remote users. Depending upon the prior use, the sequence will be determined by the remote user's interactions. First, remote user in to virtual joining portal using login information: log-in information is validated by customer module. Next, the Portal presents range of applications that are available: application server module will provide the details. Third, based on the information, remote user selects the application needed to satisfy their need. Forth, at this point the portal will validate the remote user selections and will provide scope of calculations, warnings, and usage scenarios. Fifth, the remote user agrees on the scope of calculations. Sixth the portal provides different scenarios and processing options. Seventh, the remote user selects the modeling details, optimization scheme and also the level of urgency to the job scheduler module. Job scheduler module evaluates the resources necessary. Next, the virtual portal evaluates the remote user's selections and the availability of validation for the problem scope. Then, the virtual portal evaluates the run-time estimate and associated costs. The remote user selects to go forward and then moves to the next step, if not the remote user is directed back to the third step. The job scheduler module queues the execution of the application. The job scheduler monitors the progress of calculation and provides feed back to the remote user. The results module provides the results to the remote user. The remote user views the results and decided on further calculation or completes the transactions.

This embodiment of the present invention provides numerous new and novel benefits that do not exist in the market place including: increased accessibility for FEA applications and provides one stop place for engineering domain knowledge, software knowledge and hardware access; reduce the complexity of using FEA tools for industrial manufacturing by providing access over the internet; improve knowledge retention of existing processes; reduce the endless cycle of development for manufacturing applications resulting in tremendous cost savings; creating standards for input data; and improving the competitiveness of US education and government organizations.

This embodiment of the present invention is completely different from the node-locked, a single all-in-all encompassing FEA applications that are currently available in the market place. The flexible approach of the present embodiment of the present invention allows the remote users to focus on the engineering solution rather than expensive and time-consuming technology development exercise. This provides tangible advantages of modeling tools to the final remote user.

Numerous alterations, modifications, and variations of the preferred embodiments disclosed herein will be apparent to those skilled in the art and they are all anticipated and contemplated to be within the spirit and scope of the instant invention. For example, although specific embodiments have been described in detail, those with skill in the art will understand that the preceding embodiments and variations can be modified to incorporate various types of substitute and or additional or alternative manufacturing processes and materials, relative arrangement of elements, and dimensional configurations. Accordingly, even though only few variations of the present invention are described herein, it is to be understood that the practice of such additional modifications and variations and the equivalents thereof, are within the spirit and scope of the invention as defined in the following claims. The corresponding structures, materials, acts, and equivalents of all means or step plus function elements in the claims below are intended to include any structure, material, or acts for performing the functions in combination with other claimed elements as specifically claimed.

INDUSTRIAL APPLICABILITY

The art has long sought an improvement in field of finite element analysis modeling that would allow design engineers that are not FEA experts the capability to quickly produce reliable models and preferentially schedule the associated computational resources. The method of the instant invention allows engineers to use a structured data entry system to remotely perform what would ordinarily require the custom creation of complex FEA models. Further, the structured data entry system ensures that the resulting model has been experimentally verified. The instant invention has particular advantages in the modeling of complex relationships encountered in the fields of materials joining, materials forming, heat treatment, heat transfer, and phase transformation.

We claim:

1. A system for creating computerized models of welding processes, wherein welding parameters including weld joint type, weld joint characteristics, welding method, and materials to be welded are preselected by a user of the system, and wherein the system comprises:
 (A) an interface module (200) in operative communication with the user input device (20);
 (B) an application module (300) in operative communication with the interface module (200), wherein the application module (300) incorporates:
  (i) a joining methodology database (310) containing at least one joining method (312);
  (ii) a joint geometry database (320) containing at least one joint type (330) and at least one joint profile (340);
  (iii) a modeling material database (350) containing at least one material type (360) and at least one material property (370); and
  (iv) an application qualification standard (390); wherein
  (v) the operative communication between the interface module (200) and the application module (300):
   (a) facilitates the remote user (10) selecting a user specified joining method (313) from the at least one joining method (312) of the joining methodology database (310);
   (b) facilitates the remote user (10) selecting a user specified joint type (332) from the at least one joint type (330) of the joint geometry database (320), and selecting a user specified joint profile (342) from the at least one joint profile (340) of the joint geometry database (320);
   (c) facilitates the remote user (10) selecting a user specified material type (362) from the at least one material type (360) of the modeling material database (350); and
   (d) wherein selection of a first user specified application criteria (301) from the user specified joining method (313), the user specified joint type (332), the user specified joint profile (342), or the user specified material type (362) causes the application module (300) to access the application qualification standard (390) and the application qualification standard (390) limits the selection available to the remote user (10) for a second user specified application criteria (302) from the at least one joining method (312), the at least one joint type (330), the at least one joint profile (340), and the at least one material type (360) based upon the first user specified application criteria (301);

(C) a computing module (400) in operative communication with the application module (300) and the interface module (200), wherein the computing module (400) receives the user specified joining method (313), the user specified joint type (332), the user specified joint profile (342), and the user specified material type (362), and the computing module (400) transfers the user specified joining method (313), the user specified joint type (332), the user specified joint profile (342), and the user specified material type (362) to a high-performance computing device (410) having a numerical analysis software (420), wherein:

(i) the numerical analysis software (420) is configured to receive the user specified joining method (313), the user specified joint type (332), the user specified joint profile (342), and the user specified material type (362), and automatically create an automatically generated model (430), automatically create an automatically generated solution (440) using the computing power of the high-performance computing device (410), and automatically compare a portion of the automatically generated solution (440) with a predefined solution verification standard (450); and (ii) the computing module (400) automatically transmits the automatically generated solution (440) to the interface module (200) if the automatically generated solution (440) satisfies the predefined solution verification standard (450);

(D) a scheduling module (500) in operative communication with the interface module (200) and the computing module (400), wherein the scheduling module (500) incorporates:

(i) at least two modeling priority levels (510) including at least an urgent priority level (512) and a standard priority level (514); and (ii) a modeling queue (520) for receiving, prioritizing, and storing the user specified joining method (313), the user specified joint type (332), the user specified joint profile (342), and the user specified material type (362), wherein the modeling queue (520) controls the transfer of the user specified joining method (313), the user specified joint type (332), the user specified joint profile (342), and the user specified material type (362) to the numerical analysis software (420); wherein (iii) the operative communication between the scheduling module (500) and the interface module (200) facilitates the remote user (10) selecting the urgent priority level (512) or the standard priority level (514); and wherein (E) the interface module (200) receives the automatically generated solution (440) from the computing module (400) and displays it to the remote user (10).

2. The system (100) of claim 1, wherein the interface module (200) records the selections of the remote user (10) and the amount of time spent creating the automatically generated solution (440).

3. The system (100) of claim 1, wherein the interface module (200) is in operative communication with a weld procedure information database containing at least one weld procedure, wherein the interface module (200) permits the remote user (10) to access the weld procedure information database and designate one of the at least one weld procedures wherein the designation automatically selects the user specified joining method (313), the user specified joint type (332), the user specified joint profile (342), and the user specified material type (362).

4. The system (100) of claim 3, wherein the interface module (200) allows the remote user (10) to add a user contributed weld procedure to the weld procedure information database.

5. The system (100) of claim 4, wherein the remote user (10) is assigned a credit for the user contributed weld procedure added to the weld procedure information database.

6. The system (100) of claim 1, wherein the joining methodology database (310) includes an arc welding method and a resistance welding method.

7. The system (100) of claim 1, wherein joint geometry database (320) includes a butt joint geometry and a lap joint geometry.

8. The system (100) of claim 1, wherein the application qualification standard (390) analyzes the user specified joining method (313), the user specified joint type (332), and the user specified joint profile (342), and wherein the application qualification standard (390) automatically establishes default values a welding current, a welding voltage, a wire feed speed, and a travel speed.

9. The system (100) of claim 1, wherein the modeling queue (520) controls the transfer of data to the numerical analysis software (420) and the creation of the automatically generated solution (440) based upon selection of urgent priority level (512) or standard priority level (514).

10. The system (100) of claim 9, wherein the modeling queue (520) estimates the time required to create the automatically generated solution (440) and utilizes the time estimates in prioritizing the transfer of data to the numerical analysis software (420).

11. The system (100) of claim 1, wherein the interface module (200) is in operative communication with a validation database containing a plurality of validated welding procedures of material joining processes having an experimentally validated automatically generated solution (440), wherein the interface module (200) permits the remote user (10) to access the validation database and designate one of the plurality of validated welding procedures wherein the designation automatically selects the user specified joining method (313), the user specified joint type (332), the user specified joint profile (342), and the user specified material type (362).

12. The system (100) of claim 1, wherein the interface module (200) includes a graphic display of a portion of the automatically generated solution (440) including a maximum temperature profile illustrating a maximum temperature achieved at several locations in the joint profile (340).

13. The system (100) of claim 1, wherein the interface module (200) includes a graphic display of a portion of the automatically generated solution (440) including a residual stress profile illustrating a residual stress value at several locations in the joint profile (340).

14. A method for
creating computerized models of welding processes, wherein welding parameters including weld joint type, weld joint characteristics, welding method, and materials to be welded are preselected by a user of the system, and wherein the method comprises:

(A) selecting a first user specified application criteria (301) from:
  (i) a user specified joining method (313) from a joining methodology database (310) containing at least one joining method (312);
  (ii) a user specified joint type (332) from a joint geometry database (320) having at least one joint type (330);
  (iii) a user specified joint profile (342) from a joint geometry database (320) having from the at least one joint profile (340); or
  (iv) a user specified material type (362) from a modeling material database (350) containing at least one material type (360) and at least one material property (370);
(B) comparing an application qualification standard (390) with the first user specified application criteria (301) and limiting the selection of a second user specified application criteria (302) from (i), (ii), (iii), or (iv) that is consistent with the first user specified application criteria (301);
(C) transferring the user specified joining method (313), the user specified joint type (332), the user specified joint profile (342), and the user specified material type (362) to a modeling queue (520);
(D) selecting a modeling priority level (510) from at least an urgent priority level (512) and a standard priority level (514);
(E) transferring the user specified joining method (313), the user specified joint type (332), the user specified joint profile (342), and the user specified material type (362) from the modeling queue (520) to a numerical analysis software (420) resident on a high-performance computing device (410) based upon the modeling priority level (510);
(F) creating an automatically generated model (430);
(G) creating an automatically generated solution (440) using the computing power of the high-performance computing device (410); and
(H) comparing a portion of the automatically generated solution (440) with a predefined solution verification standard (450) and displaying a portion of the automatically generated solution (440) if the automatically generated solution (440) satisfies the predefined solution verification standard (450).

15. The method of claim 14, wherein the first user specified application criteria (301) is selected from a weld procedure information database containing at least one weld procedure, wherein the remote user (10) accesses the weld procedure information database and designates one of the at least one weld procedures wherein the designation automatically selects the user specified joining method (313), the user specified joint type (332), the user specified joint profile (342), and the user specified material type (362).

16. The method of claim 15, further including the step of permitting the remote user (10) to add a user contributed weld procedure to the weld procedure information database.

17. The method of claim 16, further including the step of assigning a credit to the remote user (10) for adding a user contributed weld procedure to the weld procedure information database.

18. The method of claim 14, the steps of comparing the application qualification standard (390) with the first user specified application criteria (301) further includes analyzing the user specified joining method (313), the user specified joint type (332), and the user specified joint profile (342), and automatically establishing default values a welding current, a welding voltage, a wire feed speed, and a travel speed.

19. The method of claim 14, further including the step of estimating the amount of time required to create the automatically generated solution (440) and utilizing the time estimate to prioritize the transfer of data to the numerical analysis software (420).

20. The method of claim 14, further including the step of selecting a validated welding procedure from a validation database containing a plurality of validated welding procedures of material joining processes having an experimentally validated automatically generated solution (440), wherein the selection of the validated welding procedure automatically selects the user specified joining method (313), the user specified joint type (332), the user specified joint profile (342), and the user specified material type (362).

* * * * *